(12) United States Patent
Duvall et al.

(10) Patent No.: US 9,428,833 B1
(45) Date of Patent: Aug. 30, 2016

(54) METHOD AND APPARATUS FOR BACKSIDE DEPOSITION REDUCTION BY CONTROL OF WAFER SUPPORT TO ACHIEVE EDGE SEAL

(71) Applicant: Lam Research Corporation, Fremont, CA (US)

(72) Inventors: Andrew Duvall, Portland, OR (US); Chloe Baldasseroni, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/726,055

(22) Filed: May 29, 2015

(51) Int. Cl.
*H01L 21/31* (2006.01)
*C23C 16/455* (2006.01)
*C23C 16/52* (2006.01)
*C23C 16/458* (2006.01)
*H01L 21/02* (2006.01)
*H01L 21/285* (2006.01)
*H01L 21/67* (2006.01)

(52) U.S. Cl.
CPC ....... *C23C 16/45544* (2013.01); *C23C 16/458* (2013.01); *C23C 16/52* (2013.01); *H01L 21/0228* (2013.01); *H01L 21/0262* (2013.01); *H01L 21/28556* (2013.01); *H01L 21/67* (2013.01)

(58) Field of Classification Search
CPC .............. H01L 21/0228; H01L 21/67; H01L 21/67207; C23C 16/45544
USPC ........................................................ 438/758
See application file for complete search history.

(56) References Cited

U.S. PATENT DOCUMENTS

| | | | |
|---|---|---|---|
| 6,876,534 B2 | 4/2005 | Tossell | |
| 7,646,580 B2 | 1/2010 | Nakamura et al. | |
| 7,889,323 B2 | 2/2011 | Sung | |
| 8,371,567 B2* | 2/2013 | Angelov et al. | 269/289 R |
| 8,382,942 B2 | 2/2013 | Hatamura et al. | |
| 8,454,294 B2* | 6/2013 | Gage et al. | 414/217 |
| 2011/0318142 A1* | 12/2011 | Gage et al. | 414/217 |
| 2012/0264051 A1* | 10/2012 | Angelov et al. | 430/256 |
| 2012/0285658 A1* | 11/2012 | Roy et al. | 165/47 |

OTHER PUBLICATIONS

U.S. Appl. No. 14/578,126, entitled "Reducing Backside Deposition at Wafer Edge," by Baldasseroni et al.

* cited by examiner

*Primary Examiner* — Long K Tran
(74) *Attorney, Agent, or Firm* — Weaver Austin Villeneuve & Sampson LLP

(57) ABSTRACT

Method and apparatus for reducing backside deposition by controlling one or more wafer supports are disclosed. A processing chamber, such as a processing chamber for atomic layer deposition, can include a pedestal and one or more wafer supports configured to extend from the pedestal. A wafer can be provided over the pedestal, the one or more wafer supports can contact the backside of the wafer to support the wafer, and the one or more wafer supports can be positioned to a height to cause an outer edge of the wafer to sag. The outer edge of the wafer can sag to substantially contact the pedestal or a carrier ring surrounding the pedestal. This can create an edge seal to limit access by process gases to the backside of the wafer during a deposition process.

15 Claims, 14 Drawing Sheets

METHOD AND APPARATUS FOR BACKSIDE DEPOSITION REDUCTION BY CONTROL OF WAFER SUPPORT TO ACHIEVE EDGE SEAL

FIELD OF THE INVENTION

This disclosure generally relates to pedestals for supporting wafers in semiconductor processing tools. Certain aspects of this disclosure pertain to configuring one or more supports configured to extend from a pedestal to obtain an edge seal with the wafer, thereby preventing or otherwise reducing backside deposition.

BACKGROUND

During deposition in a processing chamber, film can be deposited not only on a frontside of a wafer, but also on a backside of the wafer. For example, in atomic layer deposition (ALD), a film can be deposited layer by layer by successive dosing and activation steps. In ALD processing chambers, precursor gases can be directed to a wafer and the precursor gases can chemisorb onto a surface of the wafer to form a monolayer. Additional precursor gases can be introduced that react with the monolayer, and a purge gas can be subsequently introduced to remove excess precursors and gaseous reaction by-products. Precursor gases can be alternately pulsed without overlap, and cycles can be repeated as many times as desired to form a film of suitable thickness.

However, during the deposition process, unwanted process gases, such as precursor gases in ALD, can be deposited on the backside of the wafer. Since ALD is a surface-based deposition process, film can be deposited on any accessible surface in the processing chamber. Thus, any gap accessing the backside of the wafer can permit process gases to flow to the backside and then deposit onto the backside of the wafer. Film on the backside can be generated by transport of precursor gases during the dose step, and the reaction of the precursor gases can occur during the activation step. In some implementations, a ring of film as thick as the frontside film at the outer edge of the wafer can extend to greater than 5 mm inward from the outer edge.

One of the drawbacks of backside deposition is that it can lead to alignment/focusing issues during lithography. To apply a desired pattern onto a target portion of the wafer, various tools in lithography can be used for proper alignment and focusing for the desired pattern. After a deposition step, if film is deposited on the backside of the wafer, then the various lithography tools may require re-adjustment in focus and alignment. This can lead to unwanted lithography traces during patterning and increased time spent re-calibrating the various lithography tools.

SUMMARY

This disclosure pertains to an apparatus for processing a wafer, where the apparatus includes a pedestal for supporting the wafer in the apparatus, the pedestal including a wafer-facing surface extending from a central axis to an outer edge. The apparatus further includes one or more wafer supports configured to extend from the pedestal to support the wafer above the wafer-facing surface, the one or more wafer supports symmetrically arranged about the central axis, and each of the wafer supports being spaced from the central axis by about half or less than half of the radius of the wafer. The apparatus further includes a controller configured with instructions for performing the following operations: (a) providing the wafer over the pedestal and the one or more wafer supports; (b) contacting a backside of the wafer with the one or more wafer supports to support the wafer above the wafer-facing surface; and (c) positioning the one or more wafer supports to a height above the wafer-facing surface to cause an outer edge of the wafer to sag and substantially contact a surface of the apparatus opposite the backside of the wafer.

In some implementations, the one or more positioned wafer supports causes the outer edge of the wafer to substantially contact the wafer-facing surface of the pedestal. In some implementations, the apparatus further includes a carrier ring having an annular body and surrounding the outer edge of the wafer-facing surface of the pedestal. The one or more positioned wafer supports causes the outer edge of the wafer to substantially contact the carrier ring. In some implementations, the one or more wafer supports includes at least three minimum contact area (MCA) support members symmetrically arranged about the central axis. In some implementations, the one or more positioned wafer supports substantially limits access by process gases to the backside of the wafer during a deposition process. In some implementations, the deposition process is ALD.

This disclosure also pertains to an apparatus for processing a wafer, where the apparatus includes a pedestal for supporting the wafer in the apparatus, the pedestal including a wafer-facing surface extending from a central axis to an outer edge. The apparatus further includes an annular wafer support arranged about the central axis and configured to support the wafer at an outer edge of the wafer. The apparatus further includes a controller configured with instructions for performing the following operations: (a) providing the wafer on the pedestal and over the annular wafer support; (b) contacting a backside of the wafer at the outer edge of the wafer with the annular wafer to support the wafer above the wafer-facing surface; and (c) positioning the annular wafer support to a height above the wafer-facing surface to induce sag at the center of the wafer.

In some implementations, the outer edge of the wafer is raised by at least about 2 mil above the wafer-facing surface of the pedestal when the annular wafer support is positioned. In some implementations, the positioned annular wafer support substantially limits access by process gases to a backside of the wafer during a deposition process.

This disclosure also pertains to a method of reducing backside deposition during wafer processing, where the method includes providing a wafer on a pedestal in a processing chamber and over one or more wafer supports configured to extend from the pedestal, the pedestal having a wafer-facing surface extending from a central axis to an outer edge, the one or more wafer supports symmetrically arranged about a central axis, each of the wafer supports being spaced from the central axis by about half or less than half of the radius of the wafer. The method further includes contacting a backside of the wafer with the one or more wafer supports to support the wafer above the wafer-facing surface, and positioning the one or more wafer supports to a height above the wafer-facing surface to cause an outer edge of the wafer to sag and substantially contact a surface in the processing chamber opposite the backside of the wafer.

In some implementations, the processing chamber further includes a carrier ring having an annular body and surrounding the outer edge of the wafer-facing surface of the pedestal, the one or more positioned wafer supports causing the outer edge of the wafer to substantially contact the carrier ring. In some implementations, the method further includes depositing by ALD a layer of material on a frontside of the wafer when the one or more wafer supports are positioned, the one or more positioned wafer supports substantially limiting access by process gases to the backside of the wafer during deposition.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Figure 1A:
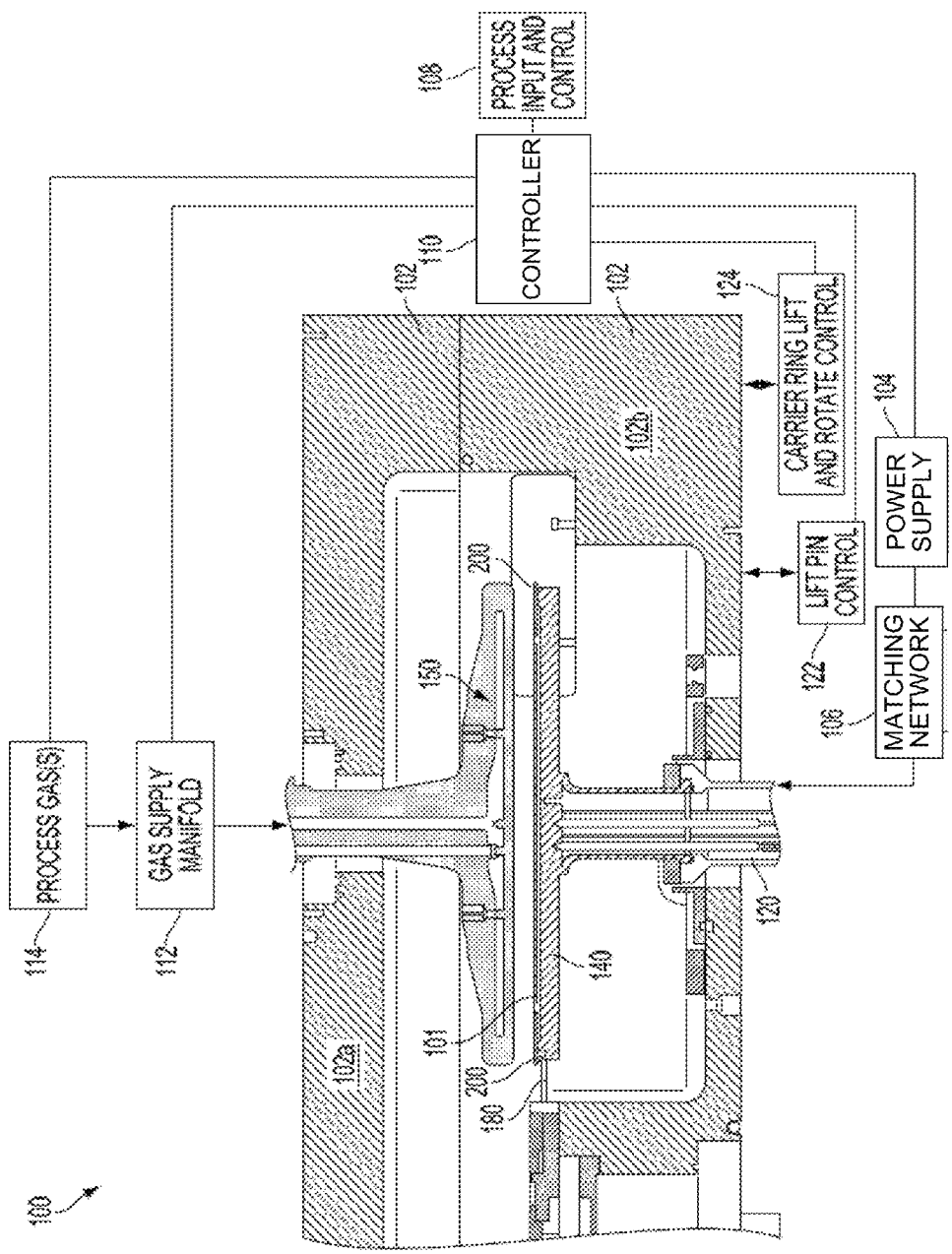
FIG. 1A shows a cross-sectional schematic of an example apparatus for processing a wafer.

FIG. 1A shows a cross-sectional schematic of an example apparatus for processing a wafer. The apparatus 100 can be used to process a wafer 101. The apparatus 100 can include a processing chamber 102 having an upper chamber portion 102a and a lower chamber portion 102b. The apparatus 100 can also include a pedestal 140 configured to support the wafer 101. In some implementations, the pedestal 140 can serve as a powered electrode. In some implementations, the pedestal 140 can be electrically coupled to a power supply 104 via a matching network 106. The power supply 104 can be controlled by a controller 110, where the controller 110 can be configured with various instructions for executing operations for the apparatus 100. The controller 110 can be configured with instructions for executing process input and control 108, which can include process recipes, such as power levels, timing parameters, deposition parameters, process gases, movement of the wafer 101, etc.

In some implementations, the apparatus 100 can include lift pins 120, which can be controlled by lift pin control 122. The lift pins 120 can be used to raise the wafer 101 from the pedestal 140 to allow for a wafer handling system (e.g., end-effector) to transport the wafer 101 to and from the pedestal 140.

In some implementations, the apparatus 100 can include a gas supply manifold 112 configured to receive process gases 114. In some implementations, the controller 110 can control the delivery of the process gases 114 via the gas supply manifold 112. Selected process gases 114 can be delivered into a showerhead 150, and the showerhead 150 can distribute the selected process gases 114 towards the wafer 101 being supported over the pedestal 140. It will be appreciated that showerhead 150 may have any suitable shape, and may have any suitable number and arrangement of ports for distributing the process gases 114 to the wafer 101.

Also shown is a carrier ring 200 that surrounds an outer region of the pedestal 140. The carrier ring 200 can be configured to support the wafer 101 during transport of the wafer 101 to and from the pedestal 140. The carrier ring 200 can include an annular body positioned around the outer region of the pedestal 140. One or more contact structures 180 (e.g., spider forks) can be configured to be lift the wafer 101 with the carrier ring 200. The carrier ring 200 can be lifted along with the wafer 101 so that the wafer 101 can be transported to another station, such as another station in a multi-station processing tool.

In some implementations, the processing chamber 102 of the apparatus 100 can be configured to deposit film on the wafer 101. In some implementations, the processing chamber 102 can be a capacitively coupled plasma processing chamber. For example, the processing chamber 102 can be configured to deposit the film by PECVD or ALD.

Figure 1B:
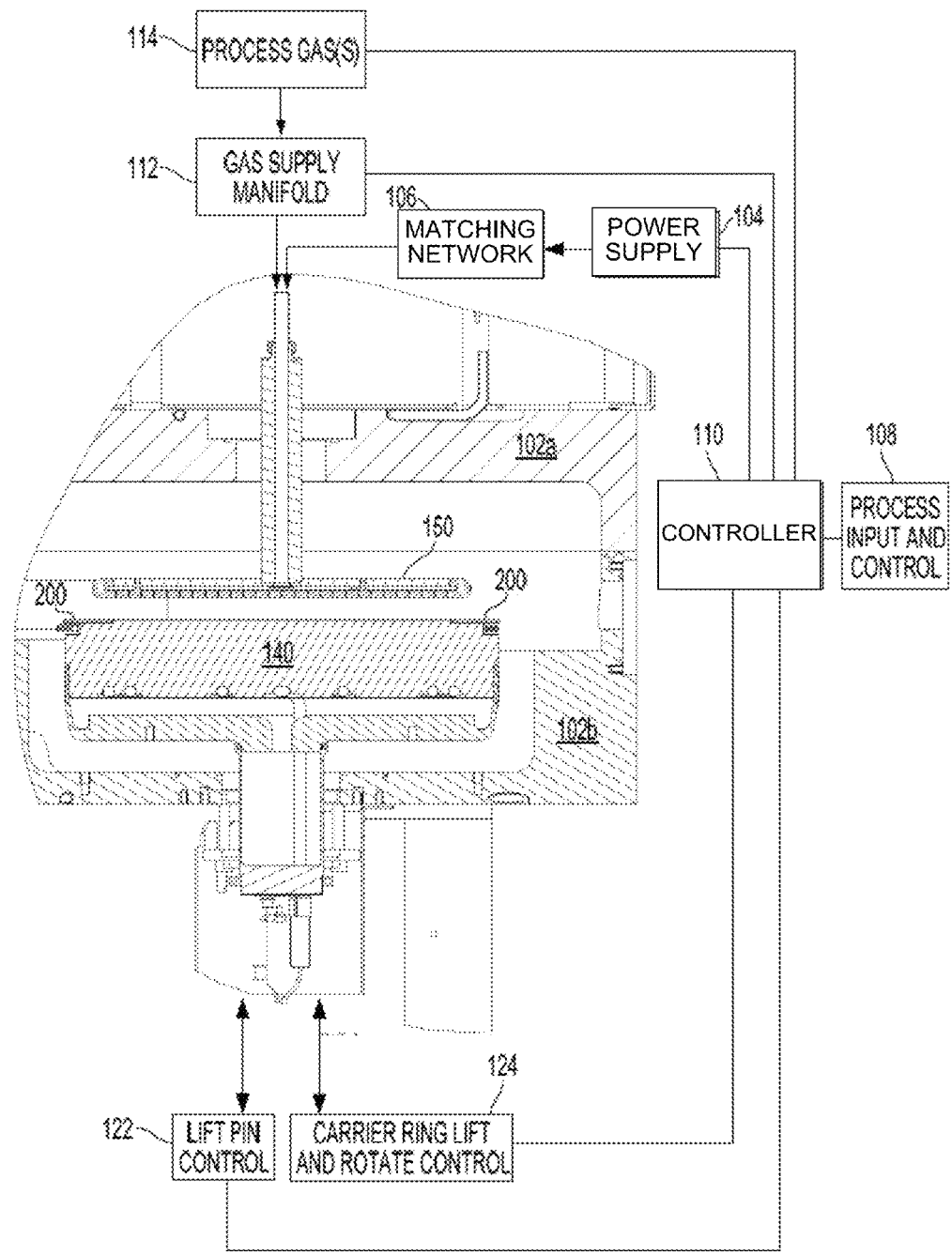
FIG. 1B shows a magnified view of a cross-sectional schematic of an example apparatus for processing a wafer.

FIG. 1B shows a magnified view of a cross-sectional schematic of an example apparatus for processing a wafer. The apparatus 100 can be configured to deposit film on the wafer 101 by ALD. The film can include ALD oxide. Similarly components of the apparatus 100 are described with reference to FIG. 1A. However, in some implementations, the power supply 140 can be supplied to the showerhead 150 as shown in FIG. 1B.

In some implementations, the apparatus 100 can further include one or more wafer supports (not shown) configured to extend from the pedestal 140 to support the wafer 101 above a wafer-facing surface of the pedestal 140. The one or more wafer supports are discussed with reference to FIGS. 3-5B below.

Figure 2:
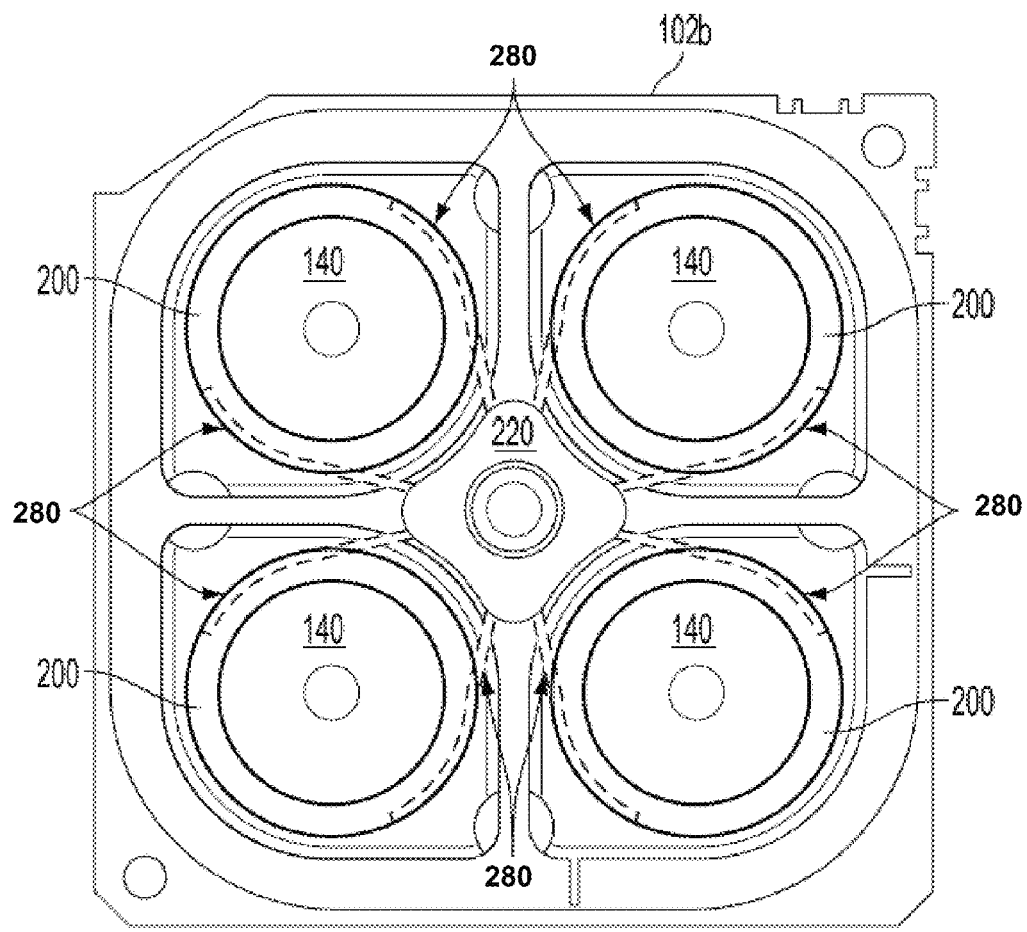
FIG. 2 shows a top view of a schematic diagram of an example multi-station processing tool.

FIG. 2 shows a top view of a schematic diagram of an example multi-station processing tool. The multi-station processing tool can include four processing stations. The top view is of the lower chamber portion 102b, with the top chamber portion 102a removed for illustration. The four processing stations can be accessed by spider forks 280. Each spider fork 280 includes a first and a second arm, each of which is positioned around a portion of each side of the pedestal 140. The spider forks 280 use an engagement and rotation mechanism 220 that can raise and lift the carrier rings 200, such as from the lower surface of the carrier rings 200, where each of the carrier rings 200 can support a wafer. This action of raising the carrier rings 200 can be performed from the processing stations simultaneously, and then a mechanism 220 is rotated before lowering the carrier rings 200 to a next one of the at least one or more processing stations so that further processing can take place on respective wafers.

Figure 3:
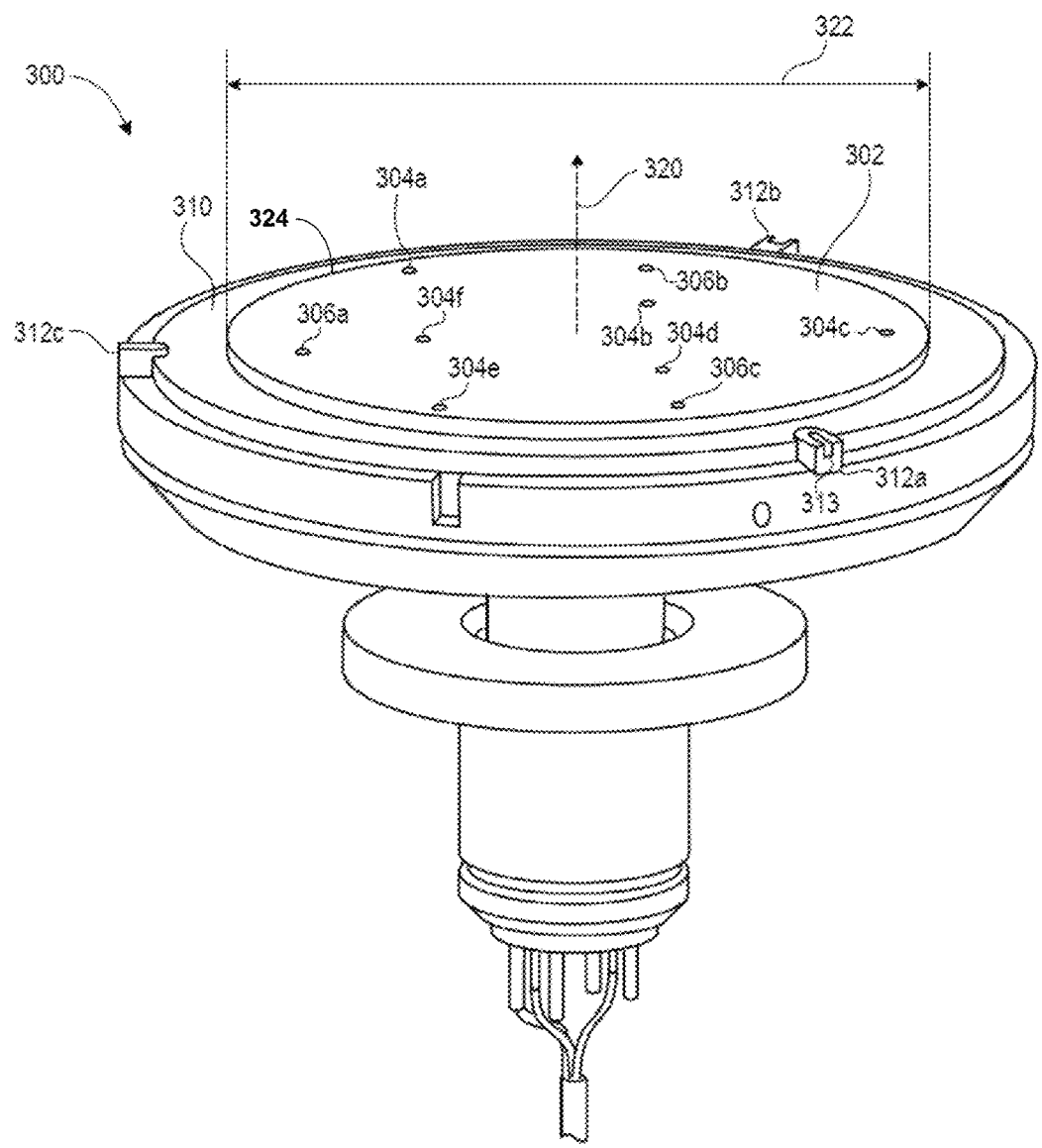
FIG. 3 shows a perspective view of an example pedestal with a plurality of wafer supports configured to extend from the pedestal, including outer and inner wafer supports.

FIG. 3 shows a perspective view of an example pedestal with a plurality of wafer supports configured to extend from the pedestal, including outer and inner wafer supports. The pedestal 300 as shown in FIG. 3 can be incorporated in the apparatus 100 in FIGS. 1A and 1B, where the pedestal 300 can be configured to receive a wafer (not shown) for a deposition process, such as ALD. The pedestal 300 includes a wafer-facing surface 302 extending from a central axis 320 to an outer edge 324. The wafer-facing surface 302 can be a circular area defined by a diameter 322. The wafer-facing surface 302 can be referred to as a mesa or a central top surface of the pedestal 300.

A plurality of wafer supports 304a, 304b, 304c, 304d, 304e, and 304f can extend from the pedestal 300 and configured to support a wafer at a level above the wafer-facing surface 302. Wafer supports 304a, 304c, and 304e can constitute outer wafer supports and wafer supports 304b, 304d, and 304f can constitute inner wafer supports. The level above the wafer-facing surface 302 can be defined by the vertical position of a backside of a wafer when supported by the wafer supports 304a, 304b, 304c, 304d, 304e, and 304f from the wafer-facing surface 302. In FIG. 3, the plurality of wafer supports 304a, 304b, 304c, 304d, 304e, and 304f includes six wafer supports, but any number of wafer supports may be distributed for supporting the wafer, such as any number between about 3 and 30 wafer supports.

In some implementations, the pedestal 300 can include the plurality of wafer supports 304a, 304b, 304c, 304d, 304e, and 304f. The wafer supports 304a, 304b, 304c, 304d, 304e, and 304f can be referred to as minimum contact area (MCA) supports for maintaining a small gap between the pedestal 300 and the backside of the wafer. MCA supports may be used to improve precision mating between surfaces when high precision or tolerances are required, and/or minimal physical contact is desired to reduce defect risk. The wafer supports 304a, 304b, 304c, 304d, 304e, and 304f may be standalone components, such as sapphire balls or pins positioned within recesses of the pedestal 300, or integrated into the pedestal 300. The wafer supports 304a, 304b, 304c, 304d, 304e, and 304f can be made of any suitable insulating material, such as a dielectric material. The height of the wafer supports 304a, 304b, 304c, 304d, 304e, and 304f may be adjustable so that the gap size may be controlled. In some implementations, the height can be between about 1 mil and about 10 mil, between about 2 mil and about 7 mil, or about 2 mil above the wafer-facing surface 302 of the pedestal 300.

A small gap is desired between the wafer and the pedestal 300 to normalize impedance. Impedance variations can be caused by the natural disparities on the surface of the pedestal 300. These natural disparities and surface roughness are present even for smooth pedestal surfaces. Thus, if a wafer is resting flat on the wafer-facing surface 302 of the pedestal 300, there can be points of intermittent contact, leaving some gaps and voids between certain areas. Areas in contact have a direct ground path from the wafer to the pedestal 300, whereas areas that are not in contact produce a built-in impedance because of the gaps and voids. As a result, some areas have low impedance while some areas have high impedance across the pedestal 300. However, the wafer supports 304a, 304b, 304c, 304d, 304e, and 304f provide a gap between the wafer and the pedestal 300 so that a large enough impedance is produced that effectively overcomes any impedance variations caused by the natural disparities on the surface of the pedestal 300. The gap provides electrical uniformity that could not be otherwise achieved by resting the wafer directly on the pedestal 300.

Additionally, the pedestal 300 can include a plurality of recesses 306a, 306b, and 306c that are configured to house lift pins. As noted above, the lift pins can be utilized to raise the wafer from the wafer supports 304a, 304b, 304c, 304d, 304e, and 304f to allow for engagement by a wafer handling system (e.g., end-effector).

Adjacent to the outer edge 324 of the wafer-facing surface 302, the pedestal 300 can further include an annular surface 310 extending around the peripheral region of the pedestal 300. The annular surface 310 can define the peripheral region of the pedestal 300 and surrounding the wafer-facing surface 302, but at a step down from the wafer-facing surface 302. That is, the vertical position of the annular surface 310 can be lower than the vertical position of the wafer-facing surface 302.

In some implementations, a plurality of carrier ring support structures 312a, 312b, and 312c can be positioned at an outer edge of the annular surface 310. The carrier ring support structures 312a, 312b, and 312c can be symmetrically arranged about the annular surface 310. The carrier ring support structures 312a, 312b, and 312c can serve as MCA supports for supporting a carrier ring. In some implementations, the carrier ring support structures 312a, 312b, and 312c can extend beyond the outer edge of the annular surface 310. In some implementations, the top surfaces of the carrier ring support structures 312a, 312b, and 312c can have a height that is higher than that of the annular surface 310, so that a carrier ring can be supported at a predefined distance above the annular surface 310. Each carrier ring support structure 312a, 312b, and 312c can include a recess 313 through which an extension protruding from the underside of the carrier side is seated when the carrier ring is supported on the carrier ring support structures 312a, 312b, and 312c. The mating of the extensions with the recesses 313 in the carrier ring support structures 312a, 312b, and 312c can provide for secure positioning of the carrier ring. While FIG. 3 illustrates three carrier ring support structures 312a, 312b, and 312c, any number of carrier ring support structures along the outer edge of the annular surface 310 and at any locations along the outer edge of the annular surface 310.

Typically, a pedestal with wafer supports hold a wafer so that the wafer is substantially parallel with the pedestal, or so that the wafer supports minimize wafer deflection or sag. The wafer supports 304a, 304b, 304c, 304d, 304e, and 304f in FIG. 3 are arranged to support the wafer above a substantially uniform gap maintained between the wafer and the wafer-facing surface 302. The wafer supports 304a, 304b, 304c, 304d, 304e, and 304f in FIG. 3 are arranged to support the wafer so that wafer deflection and sag is minimal. By way of example, the pedestal 300 in FIG. 3 can have six adjustable MCA supports 304a, 304b, 304c, 304d, 304e, and 304f, with three of the MCA supports 304b, 304d, and 304f uniformly arranged on a 5-inch bolt circle and three of the MCA supports 304a, 304c, and 304e uniformly arranged on a 10-inch bolt circle. The MCA supports 304b, 304d, and 304f can be arranged in a triangular pattern by 60 degrees, and the MCA supports 304a, 304c, and 304e can be arranged in a triangular pattern by 60 degrees.

Wafer Support Control for Wafer Sag

Typically, where wafer supports are used to maintain a small gap to minimize impedance effects, backside deposition can be reduced by actively flowing a purge gas underneath the backside of the wafer. The purge gas can prevent process gases from flowing to the backside of the wafer while the wafer is supported by the wafer supports. However, the purge gas can add complexity to the design of the processing chamber. A vacuum clamp or electrostatic chuck may be required to hold the wafer during the active purge step, and a purge system may be required for installation through the pedestal to facilitate purge gas flow. Moreover, the purge gas may flow around the backside and wrap to the frontside of the wafer, which can lead to frontside non-uniformities and affect frontside film deposition characteristics.

However, the apparatus of the present disclosure can utilize one or more wafer supports positioned and arranged in a manner to produce wafer deflection or wafer sag. In fact, the wafer sag is sufficient to contact a surface of the pedestal or a carrier ring to create an edge seal. The edge seal can serve as a barrier to limit access by process gases to the backside of the wafer during a deposition process. In some implementations, wafer sag can be produced depending on the number of wafer supports, the spacing and arrangement of the wafer supports, and the height of the wafer supports.

In some implementations, the apparatus of the present disclosure can utilize an annular wafer support configured to support the wafer at the outer edge of the wafer. The annular wafer support can contact a backside of the wafer and positioned above the pedestal and create an edge seal, where the edge seal can serve as a barrier to limit access by process gases to the backside of the wafer during a deposition process. The annular wafer support can induce sag in the wafer, particularly at the center of the wafer.

The method of the present disclosure can reduce backside deposition during wafer processing. The method can include providing a wafer on a pedestal in a processing chamber and over one or more wafer supports configured to extend from the pedestal. The pedestal can have a wafer-facing surface or mesa extending from a central axis to an outer edge. The one or more wafer supports can be symmetrically arranged about the central axis, where each of the wafer supports are spaced from the central axis by about half or less than half of the radius of the wafer. The backside of the wafer can be contacted with the one or more wafer supports to support the wafer above the wafer-facing surface. The one or more wafer supports can be positioned to a height above the wafer-facing surface, where the spatial arrangement of the one or more wafer supports and the height of the one or more wafer supports can cause an outer edge of the wafer to sag and substantially contact a surface in the processing chamber opposite the backside of the wafer. Such a surface can be a carrier ring surface or a pedestal surface. The substantial contact can form an edge seal to substantially limit access by process gases to the backside of the wafer during a deposition process.

Figure 4:
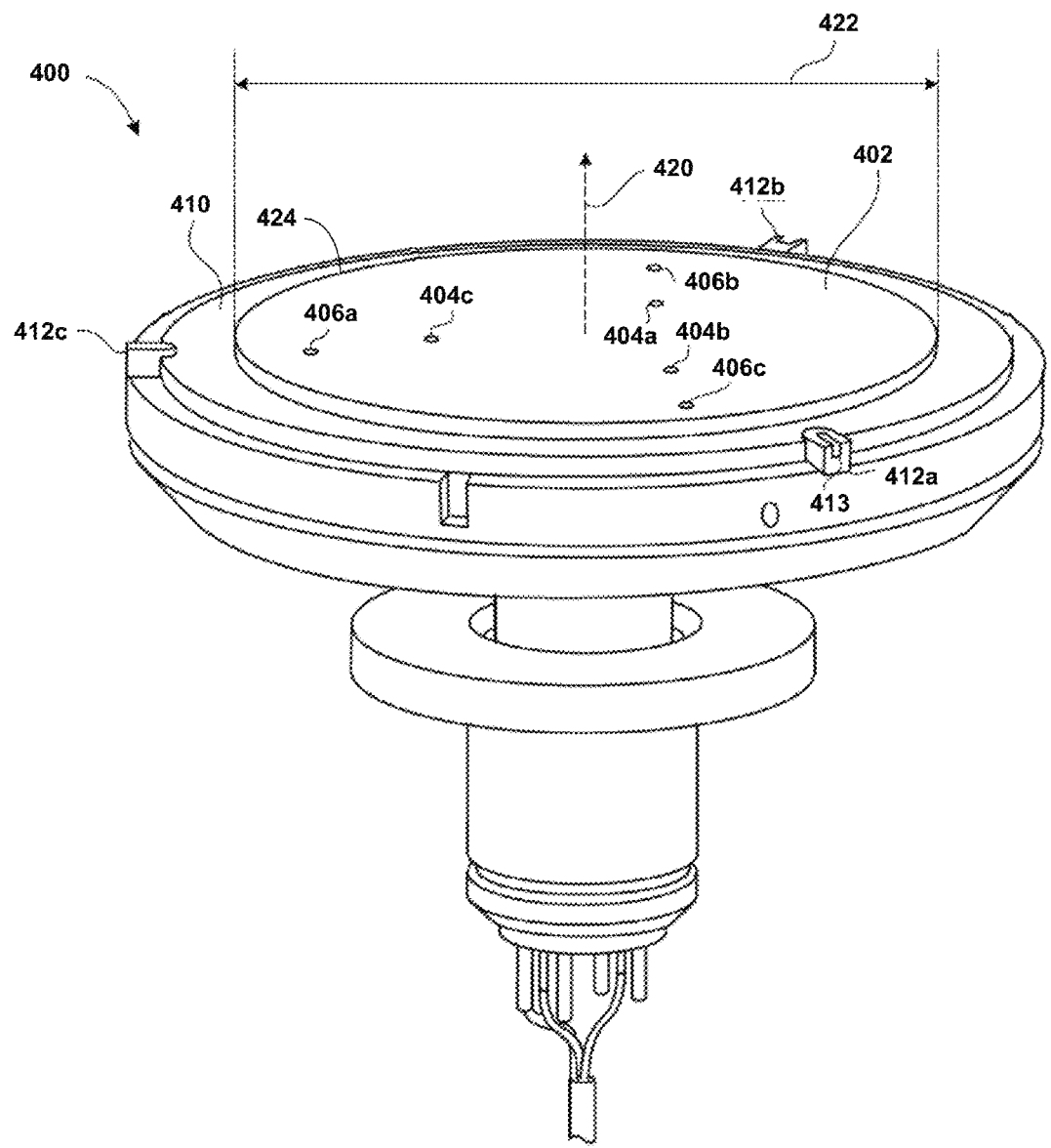
FIG. 4 shows a perspective view of an example pedestal with a plurality of wafer supports configured to extend from the pedestal, including inner wafer supports.

FIG. 4 shows a perspective view of an example pedestal with a plurality of wafer supports configured to extend from the pedestal, including inner wafer supports. The pedestal 400 as shown in FIG. 4 can be incorporated in the apparatus 100 in FIGS. 1A and 1B, where the pedestal 400 can be configured to receive a wafer for a deposition process, such as ALD. The pedestal 400 includes a wafer-facing surface 402 extending from a central axis 420 to an outer edge 424. The wafer-facing surface 402 can be a circular area defined by a diameter 422.

A plurality of wafer supports 404a, 404b, and 404c can extend from the pedestal 400 and configured to support a wafer at a level above the wafer-facing surface 402. The plurality of wafer supports 404a, 404b, and 404c in FIG. 4 can be incorporated in the apparatus 100 in FIGS. 1A and 1B. The wafer supports 404a, 404b, and 404c can be symmetrically arranged about the central axis 420 of the wafer-facing support 402. The level above the wafer-facing surface 402 can be defined by the vertical position of a backside of a wafer when supported by the wafer supports 404a, 404b, and 404c from the wafer-facing surface 402. In FIG. 4, the plurality of wafer supports 404a, 404b, and 404c include three wafer supports, but any number of wafer supports may be distributed for supporting the wafer, such as any number between about 3 and 30 wafer supports. The three or more wafer supports 404a, 404b, and 404c can constitute inner wafer supports.

In some implementations, the pedestal 400 can include the plurality of wafer supports 404a, 404b, and 404c. The wafer supports 404a, 404b, and 404c can be referred to as MCA supports for maintaining a small gap between the pedestal 400 and the backside of the wafer. MCA supports may be used to improve precision mating between surfaces when high precision or tolerances are required, and/or minimal physical contact is desired to reduce defect risk. The wafer supports 404a, 404b, and 404c may be standalone components, such as sapphire balls or pins positioned within recesses of the pedestal 400, or integrated into the pedestal 400. The wafer supports 404a, 404b, and 404c can be made of any suitable insulating material, such as a dielectric material. The height of the wafer supports 404a, 404b, and 404c may be adjustable so that the gap size may be controlled. In some implementations, the height can be between about 1 mil and about 10 mil, between about 2 mil and about 7 mil, or about 2 mil above the wafer-facing surface 402 of the pedestal 400. A gap is provided between the backside of the wafer and the pedestal 400, where the gap minimizes the effects of impedance variation as discussed earlier herein.

Additionally, the pedestal 400 can include a plurality of recesses 406a, 406b, and 406c that are configured to house lift pins. As noted above, the lift pins can be utilized to raise the wafer from the wafer supports 404a, 404b, and 404c to allow for engagement by a wafer handling system (e.g., end-effector).

Adjacent to the outer edge 424 of the wafer-facing surface 402, the pedestal 400 can further include an annular surface 410 extending around the peripheral region of the pedestal 300. The annular surface 410 can define the peripheral region of the pedestal 400 and surrounding the wafer-facing surface 402, but at a step down from the wafer-facing surface 402. That is, the vertical position of the annular surface 410 can be lower than the vertical position of the wafer-facing surface 402.

In some implementations, a plurality of carrier ring support structures 412a, 412b, and 412c can be positioned at an outer edge of the annular surface 410. The carrier ring support structures 412a, 412b, and 412c can be symmetrically arranged about the annular surface 410. The carrier ring support structures 412a, 412b, and 412c can serve as MCA supports for supporting a carrier ring. In some implementations, the carrier ring support structures 412a, 412b, and 412c can extend beyond the outer edge of the annular surface 410. In some implementations, the top surfaces of the carrier ring support structures 412a, 412b, and 412c can have a height that is higher than that of the annular surface 410, so that a carrier ring can be supported at a predefined distance above the annular surface 410. Each carrier ring support structure 412a, 412b, and 412c can include a recess 413 through which an extension protruding from the underside of the carrier side is seated when the carrier ring is supported on the carrier ring support structures 412a, 412b, and 412c. The mating of the extensions with the recesses 413 in the carrier ring support structures 412a, 412b, and 412c can provide for secure positioning of the carrier ring. While FIG. 4 illustrates three carrier ring support structures 412a, 412b, and 412c, any number of carrier ring support structures along the outer edge of the annular surface 410 and at any locations along the outer edge of the annular surface 410.

The wafer supports 404a, 404b, and 404c can be spaced apart and arranged to cause the wafer to sag. Each of the wafer supports 404a, 404b, and 404c can be spaced from the central axis at about half or less than half of the radius of the wafer. In some implementations, the wafer supports 404a, 404b, and 404c can be more proximate to the central axis 420 than the outer edge of the wafer-facing surface 402. In some implementations, such wafer supports 404a, 404b, and 404c spaced away from the outer edge of the wafer-facing surface 402 permit the wafer to sag. The wafer supports 404a, 404b, and 404c can be spatially arranged so that the gravitational pull at the outer edge of the wafer cantilevers the outer edge of the wafer sufficiently to overcome the support of the wafer supports 404a, 404b, and 404c. In some implementations, the wafer can sag between about 1 mil and about 4 mil, or at least about 2 mil. The sag can be measured from the center of the wafer when the wafer is supported by the wafer supports 404a, 404b, and 404c. The wafer supports 404a, 404b, and 404c can be referred to as inner wafer supports or central wafer supports. In some implementations, the wafer supports 404a, 404b, and 404c only maintain a portion of the wafer above the pedestal 400, and the outer edge of the wafer can sag to make contact with the pedestal 400. In some implementations, contact can be made with the carrier ring over the annular surface 410, wafer-facing surface 402, or other surface opposite the backside of the wafer.

As illustrated in the example in FIG. 4, the pedestal 400 can have three adjustable MCA supports 404a, 404b, and 404c uniformly arranged on a 5-inch bolt circle. In some implementations, the pedestal 400 can have the same setup and configuration as the pedestal 300 in FIG. 3 except that the MCA supports 304a, 304c, and 304e are removed. The MCA supports 404a, 404b, and 404c can be arranged in a triangular pattern by 60 degrees. Without outer MCA supports, such as the MCA supports 304a, 304c, and 304e in FIG. 3, the gap between the wafer and the pedestal is non-uniform, and the outer edge of the wafer can sag. In FIG. 4, with the MCA supports 404a, 404b, and 404c on a 5-inch bolt circle, the wafer sag can be at least 3 mil or less, or at least 2 mil or less. In some implementations, the MCA supports 404a, 404b, and 404c can be elevated between about 1 mil and about 3 mil from the wafer-facing surface 402.

Figure 5A:
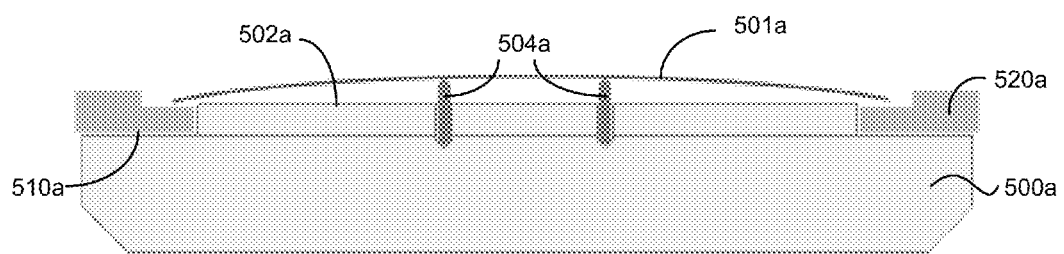
FIG. 5A shows a side view of a schematic diagram of wafer sag induced by inner wafer supports for an example pedestal with a carrier ring.
Figure 5B:
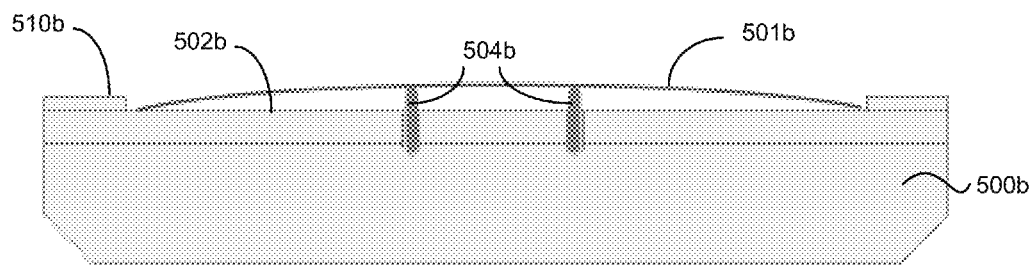
FIG. 5B shows a side view of a schematic diagram of wafer sag induced by inner wafer supports for an example single-piece pedestal.

FIG. 5A shows a side view of a schematic diagram of wafer sag induced by inner wafer supports for an example pedestal with a carrier ring. FIG. 5B shows a side view of a schematic diagram of wafer sag induced by inner wafer supports for an example single-piece pedestal. The design of the pedestal 500a in FIG. 5a can be referred to as a two-piece or two-component pedestal design, and the design of the pedestal 500b in FIG. 5B can be referred to a single-component or pocketed pedestal design.

In FIG. 5A, the pedestal 500a can include a mesa or wafer-facing surface 502a that faces the backside of a wafer 501a. The pedestal 500a can also include an annular surface 510a that is located around the wafer-facing surface 502a and a step down from the wafer-facing surface 502a. The wafer 501a can include a central region and an outer edge, where the wafer 501a can be capable of sagging/deflecting at its outer edge. The outer edge of the wafer 501a can extend beyond the wafer-facing surface 502a and over the annular surface 510a.

A carrier ring 520a surrounds an outer edge of the wafer-facing surface 502a. The carrier ring 520a can include an annular body positioned around the outer region of the pedestal 500a. In some implementations, the carrier ring 520a can be positioned around the wafer-facing surface 502a and over the annular surface 510a. The carrier ring 520a can include a step down surface positioned closer to the wafer-facing surface 502a and a raised surface positioned away from the wafer-facing surface 502a. In some implementations, the position of the carrier ring 520a can be height-adjustable so that the step down surface of the carrier ring 520a can be below, above, or coplanar with the wafer-facing surface 502a. In some implementations, the step down surface of the carrier ring 520a can be below the wafer-facing surface 502a. When the wafer 501a sags in FIG. 5A, the outer edge of the wafer 501a can contact the step down surface of the carrier ring 520a.

In addition, one or more MCA supports or wafer supports 504a can be configured to extend from the pedestal 500a and above the wafer-facing surface 502a. The one or more wafer supports 504a can be configured to support the wafer 501a above the wafer-facing surface 502a by supporting the backside of the wafer 501a. In some implementations, the one or more wafer supports 504a can be a plurality of MCA supports as described above. In some implementations, the one or more wafer supports 504a can be a single, continuous ring or ring ledge, where the single, continuous ring or ring ledge can have an annular body extendable from the pedestal 500a. The single, continuous ring or ring ledge may have cutouts to avoid creating a trapped volume. It will be understood that any number of wafer supports 504a having any suitable geometry may be used to support the wafer 501a above the wafer-facing surface 502a and permit wafer sag at the outer edge of the wafer 501a.

In some implementations, the spacing of the one or more wafer supports 504a can control the amount of sag/deflection induced at the outer edge of the wafer 501a. The spacing or positioning of the one or more wafer supports 504a from the center of the pedestal 500a can cause the wafer 501a to form a cantilever with the one or more wafer supports 504a. The gravitational pull at the outer edge of the wafer 501a can overcome the spacing of the one or more wafer supports 504a so that the outer edge of the wafer 501a suspended over the wafer-facing surface 502a can sag/deflect. Thus, the closer the one or more wafer supports 504a are positioned towards the center of the pedestal 500a, greater sag/deflection can occur. The amount of deflection can be determined by a cantilever beam deflection equation, where the amount of deflection is directly proportional to the cube of the distance from the outer edge of the wafer 501a to the one or more wafer supports 504a. For example, a cantilever beam deflection equation can be represented by $\delta=Px^3/3EI$, where $\delta$ is the deflection at the at the outer edge of the wafer 501a, x is the span or the distance from the outer edge to the one or more wafer supports 504a, P is the load, E is the modulus of elasticity, and I is the area of moment of inertia. Depending on the diameter of the wafer 501a, the spacing of the one or more wafer supports 504a can vary. In some implementations, the one or more wafer supports 504a can be spaced from the center of the pedestal 500a by half or less than half the radius of the wafer 501a, or less than a third of the radius of the wafer 501a. The position of wafer supports 504a can be determined based upon the aforementioned beam deflection equation to attain the required amount of wafer edge sag to accomplish the edge seal.

In addition, the height of the one or more wafer supports 504a can be controlled to achieve substantial contact between the wafer 501a and the carrier ring 520a. The height of the wafer supports 504a can refer to the vertical position of the wafer support 504a above the wafer-facing surface 502a. The height of the one more wafer supports 504a can be sufficiently high to overcome impedance variations. Otherwise, more than the outer edge of the wafer 501a may be in contact with a surface below the backside of the wafer 501a. The height of the one or more wafer supports 504a can be sufficiently low to permit the outer edge of the wafer 501a to substantially contact a surface below the backside of the wafer 501a, such as the carrier ring 520a. Otherwise, the outer edge of the wafer 501a may sag/deflect but not make contact with any surface opposite the backside of the wafer 501a. In some implementations, the height of the one or more wafer supports 504a can be between about 1 mil and about 4 mil, or between about 1 mil and about 3 mil, or between about 2 mil and about 4 mil.

When the spatial arrangement of the one or more wafer supports 504a and/or the height of the one or more wafer supports 504a are controlled, the amount of wafer sag/deflection can be sufficient to achieve an edge seal. In other words, the spatial arrangement and/or height of the one or more wafer supports 504a can be controlled so that the wafer sag/deflection substantially limits access by process gases to the backside of the wafer 501a during a deposition process, such as ALD.

In some implementations, the edge seal can be created when there is substantial contact by the outer edge of the wafer 501a with a surface opposite the backside of the wafer 501a. Substantial contact can be achieved where at least 80% of the outer edge of the wafer 501a makes contact with the surface opposite the backside of the wafer 501a, where at least 90% of the outer edge of the wafer 501a makes contact with the surface opposite the backside of the wafer 501a, or where at least 95% of the outer edge of the wafer 501a makes contact with the surface opposite the backside of the wafer 501a.

In FIG. 5B, the surface opposite the backside of a wafer 501b can be a wafer-facing surface 502b. A pedestal 500b can be a single-piece or pocketed pedestal design. In some implementations, the pedestal 500b can be made out of a single material, such as a metal (e.g., aluminum). There is no carrier ring that the wafer-facing surface 502b is above, below, or coplanar with. Instead, the pedestal 500b can include an annular surface 510b that is elevated or raised above the wafer-facing surface 502b. One or more wafer supports 504b can extend from the pedestal 500b to support a wafer 501b. The spatial arrangement and the height of the one or more wafer supports 504b can be controlled so that the sag/deflection of the wafer 501b can make substantial contact with a surface opposite the backside of the wafer 501b, such as the wafer-facing surface 502b.

In some implementations, the scheme can be inverted so that an annular wafer support or annular support member is arranged to support a wafer at the outer edge of the wafer rather than near the center of the wafer. The annular support member can be continuous so that the outer edge of the wafer makes substantial contact with the annular wafer support to form an edge seal. In some implementations, the annular support member can be the carrier ring. The annular wafer support can be positioned to a height sufficiently above a wafer-facing surface of a pedestal to induce sag in the wafer. The induced sag can occur at the center of the wafer, causing the center of the wafer to sag towards the pedestal. The gravitational force exerted by the wafer over the edge lift conditions creates a strong line contact band around the edge of the wafer. The contact band serves as the same seal as the edge seal discussed above.

Figure 5C:
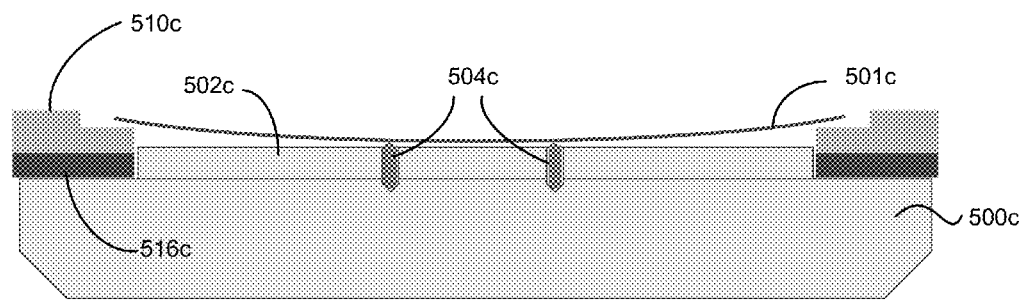
FIG. 5C shows a side view of a schematic diagram of wafer sag induced by an example carrier ring supporting a wafer at its edge.

FIG. 5C shows a side view of a schematic diagram of wafer sag induced by an example carrier ring supporting a wafer at its edge. A pedestal 500c includes a wafer-facing surface 502c over which a wafer 501c is supported, and a carrier ring 510c surrounds the pedestal 500c. One or more wafer supports 504c extend from the wafer-facing surface 502c of the pedestal 500c. The one or more wafer supports 504c do not contact the outer edge of the wafer 501c. The one or more wafer supports 504c may be more proximate the center of the wafer 501c than the outer edge of the wafer 501c. Though the one or more wafer supports 504c do not contact the outer edge of the wafer 501c, the carrier ring 510c may contact the outer edge of the wafer 501c. In some implementations, the carrier ring 510c can constitute an annular support member. The carrier ring 510c can have a step down surface and a top surface extending from the step down surface. The step down surface of the carrier ring 510c may support the wafer 501c at its outer edge. In FIG. 5C, one or more shims 516c may be positioned between the pedestal 500c and the carrier ring 510c, where the one or more shims 516c may support the carrier ring 510c. The one or more shims 516c may elevate the carrier ring 510c to a height to support the outer edge of the wafer 501c to induce sag at the center of the wafer 501c. The one or more shims 516c elevate the carrier ring 510c sufficiently so that the wafer 501c is elevated above the wafer-facing surface 502c. The elevation is sufficient so that the gravitational force exerted on the wafer 501c creates an edge seal at the outer edge of the wafer 501c and induces sag at the center of the wafer 501c. In some implementations, the induced sag can cause a portion of the wafer 501c to contact the wafer-facing surface 502c and/or the one or more wafer supports 504c.

Figure 5D:
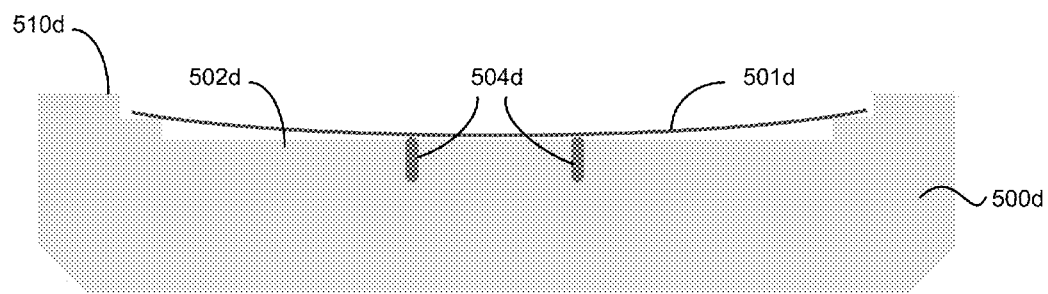
FIG. 5D shows a side view of a schematic diagram of wafer sag induced by an example pedestal supporting a wafer at its edge.

FIG. 5D shows a side view of a schematic diagram of wafer sag induced by an example pedestal supporting a wafer at its edge. Instead of supporting the outer edge of a wafer 501d by a carrier ring, the outer edge of the wafer 501d is supported by a pedestal 500d. The pedestal 500d can be a single-pedestal or pocketed pedestal design. In some implementations, the pedestal 500d can be made out of a single material, such as a metal (e.g., aluminum). There is no carrier ring that the wafer-facing surface 502d is above, below, or coplanar with. Instead, the pedestal 500d can include an annular surface 510d that is elevated or raised above the wafer-facing surface 502d. In some implementations, the annular surface 510d can constitute an annular support member. One or more wafer supports 504d can extend from the pedestal 500d, though the one or more wafer supports 504d do not support the outer edge of the wafer 501d. The annular surface 502d can be elevated sufficiently to support the outer edge of the wafer 501d so that the wafer 501d is elevated above the wafer-facing surface. In addition, the annular surface 502d can be elevated sufficiently to induce wafer sag at the center of the wafer 501d. Thus, the elevation is sufficient so that the gravitational force exerted on the wafer 501d creates an edge seal at the outer edge of the wafer 501d and induces sag at the center of the wafer 501d. In some implementations, the induced sag can cause a portion of the wafer 501d to contact the wafer-facing surface 502d and/or the one or more wafer supports 504d.

Figure 6A:
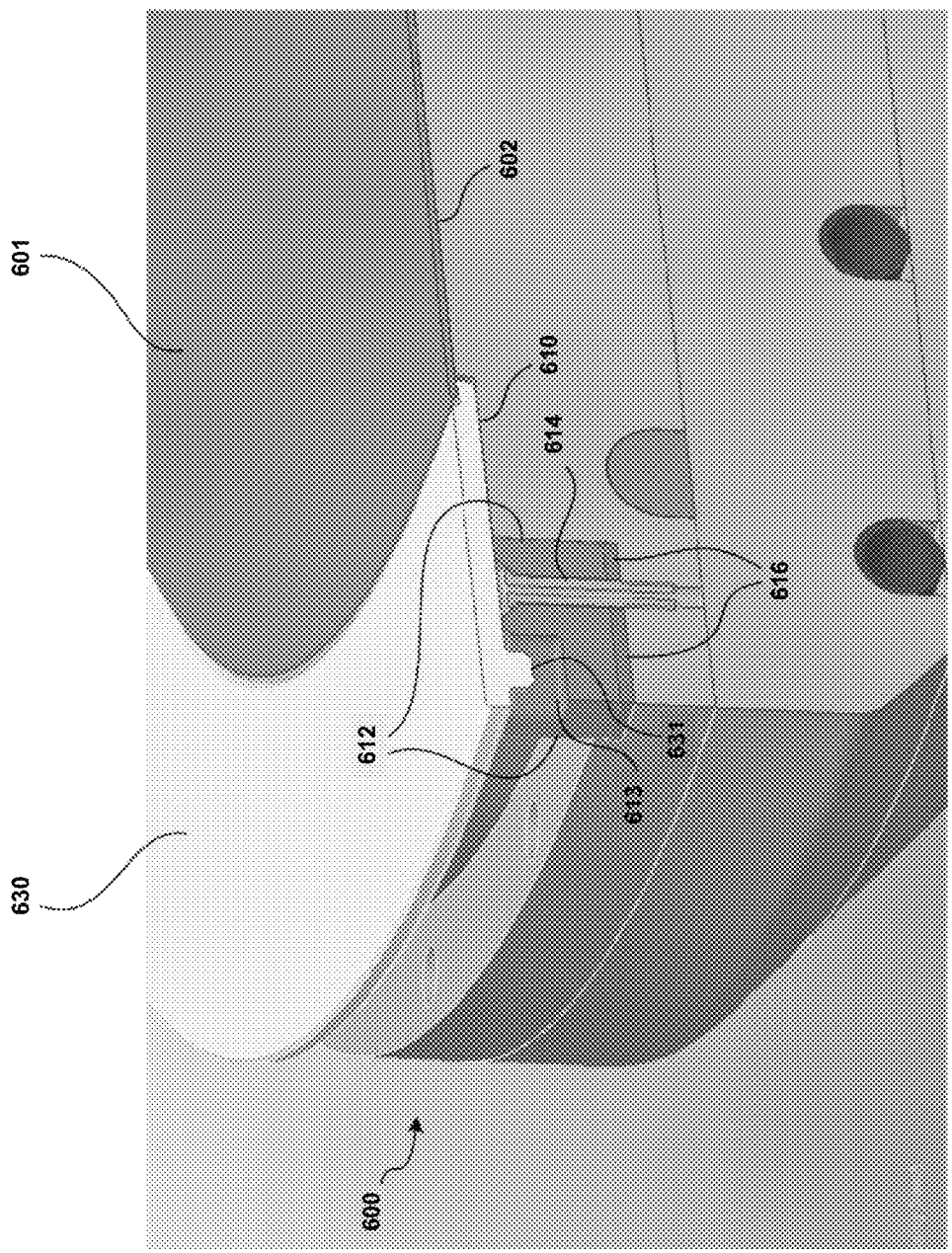
FIG. 6A shows a perspective cutaway view of a portion of an example pedestal with a carrier ring.

FIG. 6A shows a perspective cutaway view of a portion of an example pedestal with a carrier ring. A carrier ring 630 is shown resting atop a carrier ring support 612 over an annular surface 610. In some implementations, a carrier ring extension 631 is seated within a recess 613 of the carrier ring support 612. Also, a wafer 601 is shown resting over the wafer-facing surface 602 of the pedestal 600, where the wafer 601 is supported by wafer supports (not shown). The height of the carrier ring support 612 is adjustable, so as to allow the distance above the annular surface 610 of the pedestal 600 to be adjusted. In some implementations, the carrier ring support 612 includes a spacer 616 (e.g., a shim) for adjusting the height of at least one of the carrier ring supports 612. That is, the spacer 616 can be selected to provide for a controlled distance between the carrier ring 630 and the annular surface 610 when the carrier ring 630 is resting on the carrier ring support 612. It will be appreciated that there may be zero, one, or more than one spacers 616 selected and positioned beneath the carrier ring support 612 to provide for the desired distance between the annular surface 610 and the carrier ring 630.

Additionally, the carrier ring support 612 and the spacer(s) 616 can be secured to the pedestal 600 by fastening hardware 614. In some implementations, the hardware 614 can include a screw, bolt, nail, pin, or other type of hardware suitable for securing the carrier ring support 612 and the spacer(s) 616 to the pedestal 600. In other implementations, other techniques/materials for securing the carrier ring support 612 and the spacer(s) 616 to the pedestal 600 can be utilized, such as a suitable adhesive.

Figure 6B:
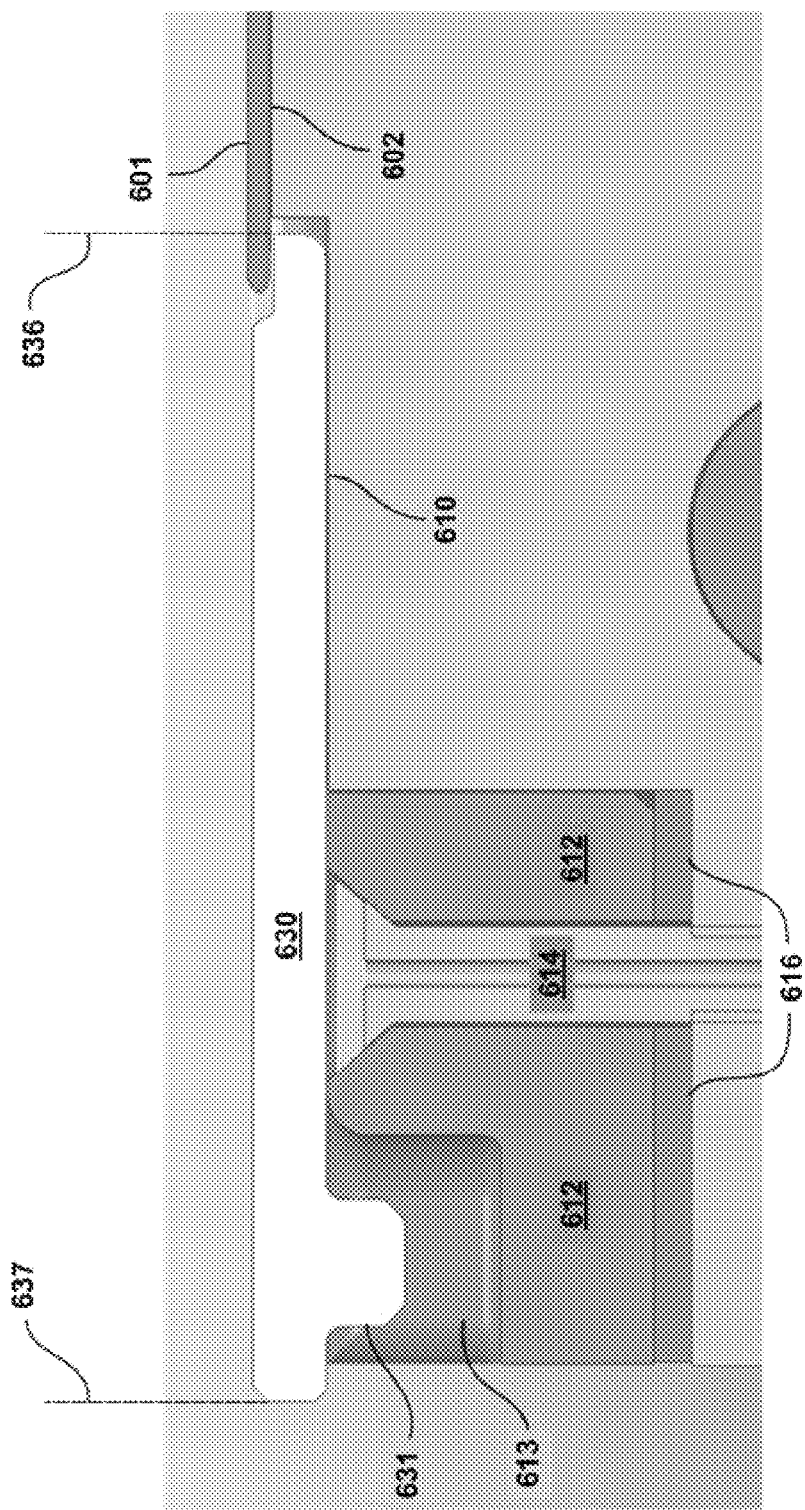
FIG. 6B shows a cross-section view of a portion of the example pedestal with the carrier ring of FIG. 6A.

FIG. 6B shows a cross-section view of a portion of the example pedestal with the carrier ring of FIG. 6A. The total height of the carrier ring support 612 can be defined by the combined height of the spacer 616 and the carrier ring support 612. This can also determine the extent to which the top surface of the carrier ring support 612 is higher than the annular surface 610 of the pedestal 600.

Figure 6C:
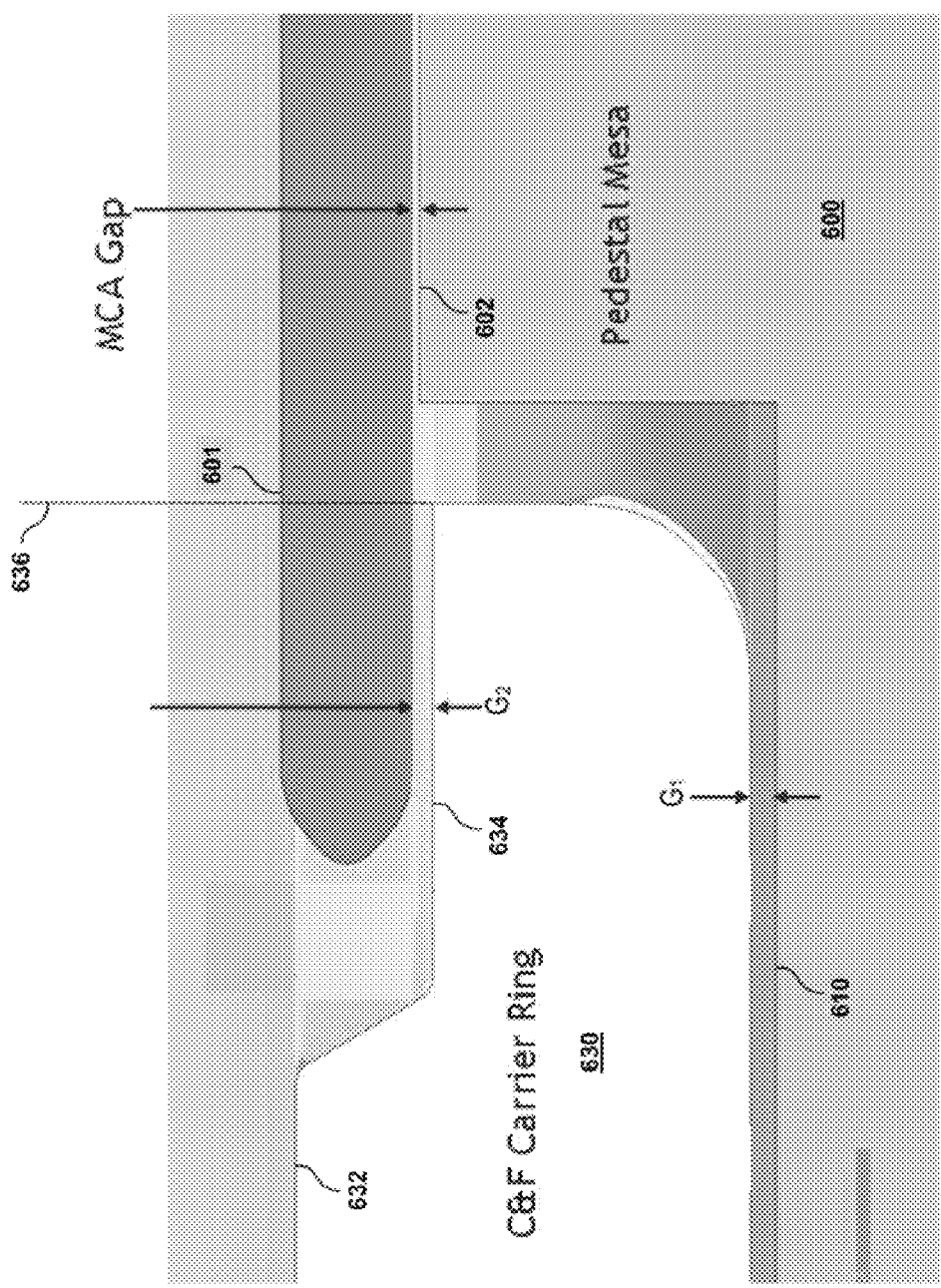
FIG. 6C shows a cross-section view of an outer edge of the example pedestal with the carrier ring and wafer of FIG. 6A.

FIG. 6C shows a cross-section view of an outer edge of the example pedestal with the carrier ring and wafer of FIG. 6A. One or more gaps can separate the wafer 601 from the carrier ring 630, and the carrier ring 630 from the annular surface 610. The one or more gaps can provide pathways for the transport of process gases (e.g., precursors, radical species, etc.) to the backside of the wafer 601. As illustrated in FIG. 6C, the carrier ring 630 includes an annular body having a top surface 632 and a step down surface 634. The top surface 632 and the step down surface 634 can be joined by a transition step. It will be appreciated that the step down surface 634 is defined proximate the inner diameter 636 of the carrier ring 630 and extends outwards from the inner diameter 636. The top surface 632 extends from the step down surface 634 to the outer diameter 637 (shown in FIG. 6B) of the carrier ring 630.

A lower gap G1 can exist between the bottom surface of the carrier ring 630 and the annular surface 610 of the pedestal 600. Additionally, an upper gap G2 can exist between a top surface of the carrier ring 630 and the backside of the wafer 601. It will be appreciated that each of the lower gap G1 and the upper gap G2 provide pathways for process gases to be transported to the backside of the wafer 601 during a deposition process. Therefore, controlling these gaps can minimize backside deposition as well.

The size of the lower gap G1 can be defined by the vertical separation between the annular surface 610 and the bottom surface of the carrier ring 630 when the carrier ring 630 is supported by the carrier ring support 612.

The size of the upper gap G2 between the wafer 601 and the carrier ring 630 can be defined by the vertical separation between the step down surface 634 and the backside of the wafer 601 when the wafer 601 is supported by one or more wafer supports above a wafer-facing surface 602. It will be appreciated that the size of the upper gap G2 can result from a variety of factors, including the size of the lower gap G1, the thickness of the carrier ring 630 in the region of the step down surface 634, the difference in vertical position between the annular surface 610 and the wafer-facing surface 602, and the distance above the wafer-facing surface 602 that the wafer 601 is maintained by the one or more wafer supports.

In some implementations, the lower gap G1 can be less than about 16 mil, such as between about 0 mil to 6 mil. In some implementations, the upper gap G2 can be less than about 10 mil, such as between about 0 mil to 5 mil. In some implementations, the upper gap G2 can be less than about 3 mil, or less than about 1 mil. Where the upper gap G2 is less than about 1 mil and even 0 mil, an edge seal can be formed to limit backside deposition.

Returning to FIGS. 1A and 1B, a system controller 110 can be configured with instructions for performing one or more operations of the apparatus, including operations to control the one or more wafer supports. Control of the one or more wafer supports can include control of the spatial arrangement and/or height of the one or more wafer supports, for example. The system controller 110 may also control other parameters for limiting backside deposition, such as the size of the gap between the bottom surface of a carrier ring and a pedestal and the size of the gap between an upper surface of a carrier ring and a wafer.

The system controller 110 provides electronic and interface controls required to operate the apparatus 100. The system controller 110 (which may include one or more physical or logical controllers) controls some or all of the properties of the apparatus 100. The system controller 110 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 110 or they may be provided over a network. In certain implementations, the system controller 110 executes system control software.

The system control software in the apparatus 100 may include instructions for controlling conditions in the processing chamber 102. This can include instructions for controlling pedestal temperature, lift pins, wafer supports, gas flows, chamber pressure, wafer position, wafer rotation, timing, carrier ring position, and other parameters performed by the apparatus 100. System control software may be configured in any suitable way. For example, various process tool component sub-routines or control objects may be written to control operation of the process tool components necessary to carry out various process tool processes. System control software may be coded in any suitable computer readable programming language.

In some implementations, system control software includes input/output control (IOC) sequencing instructions for controlling the various parameters described above. For example, each phase of positioning a wafer by positioning one or more wafer supports may include one or more instructions for execution by the system controller 110, each phase of controlling the gaps between the wafer and the pedestal as well as the wafer and the carrier ring may include one or more instructions for execution by the system controller 110, and each phase of deposition of film on the wafer may include one or more instructions for execution by the system controller 110. In some implementations, the phases of positioning the substrate and deposition may be sequentially arranged, so that all instructions for a process phase are executed concurrently with that process phase.

Other computer software and/or programs may be employed in some implementations. Examples of programs or sections of programs for this purpose include a wafer positioning program, a wafer support positioning program, a carrier ring positioning program, a pressure control program, a heater control program, and a potential/current power supply control program. Other examples of programs or sections of this program for this purpose include a timing control program, lift pins positioning program, a pedestal positioning program, a pedestal temperature control program, a showerhead temperature control program, a process gas control program, and a purge gas control program.

In some implementations, there may be a user interface associated with the system controller 110. The user interface may include a display screen, graphical software displays of the apparatus and/or process conditions, and user input devices such as pointing devices, keyboards, touch screens, microphones, etc.

Signals for monitoring the process may be provided by analog and/or digital input connections of the system controller 110 from various process tool sensors. The signals for controlling the process may be output on the analog and digital output connections of the process tool. Non-limiting examples of process tool sensors that may be monitored include mass flow controllers, pressure sensors (such as manometers), thermocouples, etc. Appropriately programmed feedback and control algorithms may be used with data from these sensors to maintain process conditions, such as temperature of the substrate.

These systems may be integrated with electronics for controlling their operation before, during, and after processing of a semiconductor wafer or substrate. In general, the electronics are referred to as the controller 110, which may control various components or subparts of the system or systems. The controller 110, depending on the processing requirements and/or the type of system, may be programmed to control any of the processes disclosed herein, including the positioning of wafer supports, the positioning of the carrier ring, delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool, and other transfer tools and/or load locks connected to or interfaced with a specific system.

Broadly speaking, the controller 110 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 110 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, surfaces, circuits, and/or dies of a wafer.

The controller 110, in some implementations, may be a part of or coupled to a computer that is integrated with, coupled to the system, otherwise networked to the system, or a combination thereof. For example, the controller 110 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 110 receives instructions in the form of data, which specify parameters for each of the processing steps to be performed during one or more operations. It should be understood that the parameters may be specific to the type of process to be performed and the type of tool that the controller 110 is configured to interface with or control. Thus as described above, the controller 110 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

The system controller 110 in the apparatus 100 can be configured with instructions for performing the following operations: (1) providing the wafer 101 over the pedestal 140 and the one or more wafer supports; and (2) contacting a backside of the wafer 101 with the one or more wafer supports to support the wafer above a wafer-facing surface of the pedestal 140 wherein the one or more wafer supports are positioned so that the outer edge of the wafer 101 sags and substantially contacts a surface of the apparatus 100 opposite the backside of the wafer 101. The one or more wafer supports may be described with respect to FIGS. 4-5B. In some implementations, the one or more wafer supports may be symmetrically arranged about the central axis of the pedestal, and may be spaced from a central axis by about half or less than half of the radius of the wafer. In some implementations, the height of the one or more wafer supports may be between about 1 mil and about 3 mil. In some implementations, the system controller 110 can be configured to perform the operation of depositing by ALD a layer of material on a frontside of the wafer 101 when the one or more wafer supports are positioned, the one or more positioned wafer supports substantially limiting access by process gases to the backside of the wafer during deposition.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

Examples and Data

Figure 7:
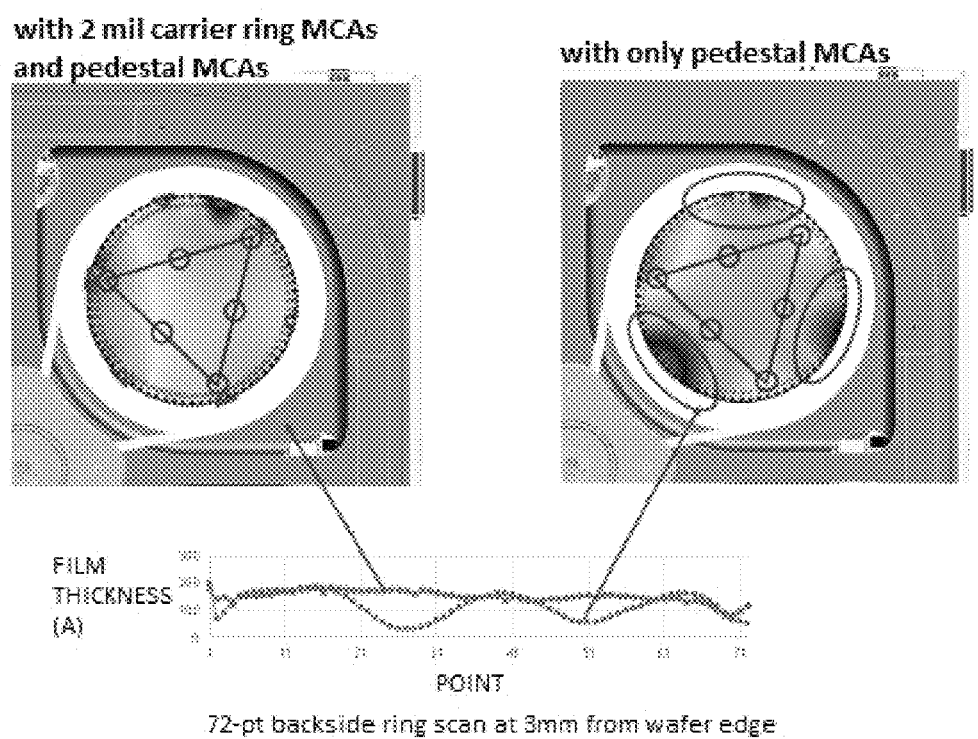
FIG. 7 shows imaging scans and a graph of backside deposition comparing a wafer over both carrier ring supports and wafer supports versus a wafer over only wafer supports.

FIG. 7 shows imaging scans and a graph of backside deposition comparing a wafer over both carrier ring supports and wafer supports versus a wafer over only wafer supports. The imaging scan can scan 72 points along a backside of the wafer at 3 mm from the outer edge of the wafer, and backside deposition film thicknesses corresponding to each of the 72 points can be mapped onto a graph. The imaging scan on the left-hand side shows a wafer being supported by six pedestal MCA supports as well as by six carrier ring MCA supports. The carrier ring MCA supports are elevated above the step down surface of the carrier ring by about 2 mil. As shown by the graph and by the imaging scan on the right-hand side, backside deposition is relatively uniform across the backside of the wafer. The carrier ring MCA supports may serve to space the outer edge of the wafer from touching the carrier ring, leaving a pathway for process gases to reach the backside of the wafer. The imaging scan on the right-hand side shows a wafer being supported by six pedestal MCA supports. The six pedestal MCA supports can include three inner pedestal MCA supports and three outer pedestal MCA supports. However, there are no carrier ring MCA supports to space the wafer from the carrier ring. Without carrier ring MCA supports, the step down surface of the carrier ring is flat. It is possible for the outer edge of the wafer to make contact with the carrier ring. As shown in FIG. 7, at least three spots on the wafer are shown having low backside deposition. These spots of low backside deposition correspond to regions around the outer edge of the wafer not supported by the three outer pedestal MCA supports. Thus, points furthest away from the pedestal MCA supports can tend to sag and make edge contact to produce a seal, so regions around the outer edge of the wafer not supported by pedestal MCA supports likely make contact with the carrier ring to limit backside deposition.

Figure 8:
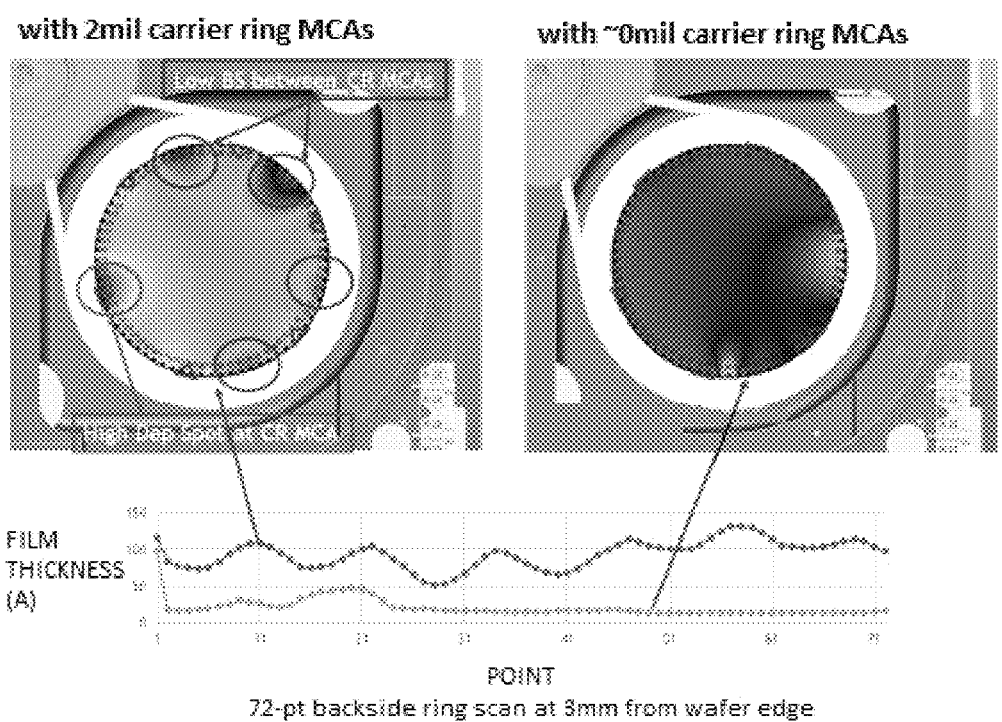
FIG. 8 shows imaging scans and a graph of backside deposition comparing a wafer over only carrier ring supports versus a wafer over virtually no carrier ring supports and no wafer supports.

FIG. 8 shows imaging scans and a graph of backside deposition comparing a wafer over only carrier ring supports versus a wafer over virtually no carrier ring supports and no wafer supports. The imaging scan on the left-hand side shows a wafer being supported by six carrier ring MCA supports but without any pedestal MCA supports. The six carrier ring MCA supports are elevated above the step down surface of the carrier ring by about 2 mil. Generally, the carrier ring MCA supports prevent the outer edge of the wafer from making contact with the carrier ring itself. However, as shown in the left-hand side of FIG. 8, several high backside deposition spots appear at the carrier ring MCA supports, and several low backside deposition spots appear between the carrier ring MCA supports, indicating that the wafer is sagging between the carrier ring MCA supports to make contact with the carrier ring. Nonetheless, the carrier ring MCA supports raise the wafer from the carrier ring to create a pathway for process gases to deposit onto the backside of the wafer. The imaging scan on the right-hand side shows a wafer supported by six carrier ring MCA supports and without any pedestal MCA supports. The six carrier ring supports are elevated above the step down surface of the carrier ring by a marginal amount of less than about 1 mil. The amount of vertical separation is so small that the carrier ring MCA supports are effectively 0 mil, allowing the wafer to effectively lay flat on the carrier ring. The outer edge of the wafer can be contacting the carrier ring to form an edge seal, thereby reducing backside deposition throughout the wafer.

The imaging scan on the right-hand side shows that a carrier ring or other structure can be used to create an edge seal with the outer edge of the wafer, and limit backside deposition. Carrier ring MCA supports can be slightly elevated above a wafer-facing surface of the pedestal and support the wafer above the wafer-facing surface of the pedestal, allowing the outer edge of the wafer to make substantial contact with the carrier ring to create the edge seal. This represents one way to make an edge seal to limit backside deposition. Another way to make an edge seal to limit backside deposition is to bring the outer edge of the wafer to the carrier ring, rather than bringing the carrier ring to the outer edge of the wafer.

Figure 9:
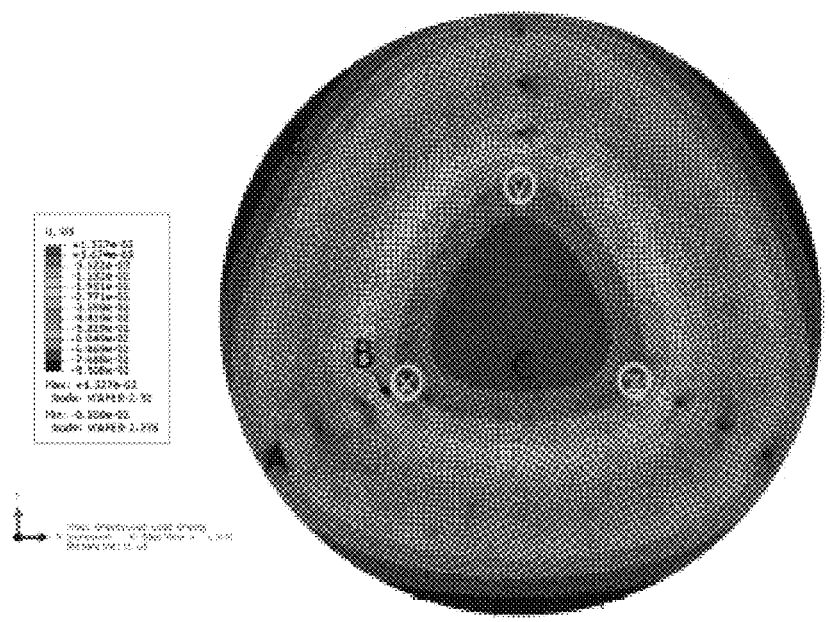
FIG. 9 shows a modeling result of the displacement of a wafer supported by three inner wafer supports mapping data points for wafer sag.

FIG. 9 shows a modeling result of the displacement of a wafer supported by three inner wafer supports mapping data points for wafer sag. Three pedestal MCA supports can extend from the pedestal to support a wafer as indicated by points x, y, and z. The three pedestal MCA supports can be spaced 2.5 inches from the center of the pedestal and arranged in a triangular pattern. With three inner wafer supports, the modeled wafer sag can be about 3 mil at points A and E, where points A and E are located at the outer edge of the wafer. Points B and C near the center of the pedestal do not show much wafer sag, as expected. Table 1 shows the measured wafer sag at points A, B, C, and E. The uncertainty between the measured data and the calculated model was within a repeatability of ±0.2 mil.

TABLE 1

| Location | Wafer sag (mil) | Plane height, based on MCA (mil) | Measured gap (mil) | Measured sag - model (mil) |
|---|---|---|---|---|
| A | −2.56 | 3.6 | 1.3 | 0.2 |
| B | −0.28 | 3.7 | 4.1 | 0.7 |
| C | 0.28 | 3.7 | 4.7 | 0.7 |
| E | −3.03 | 4.0 | 1.1 | 0.2 |
| x |  | 3.7 |  |  |
| y |  | 3.9 |  |  |
| z |  | 3.7 |  |  |

Figure 10:
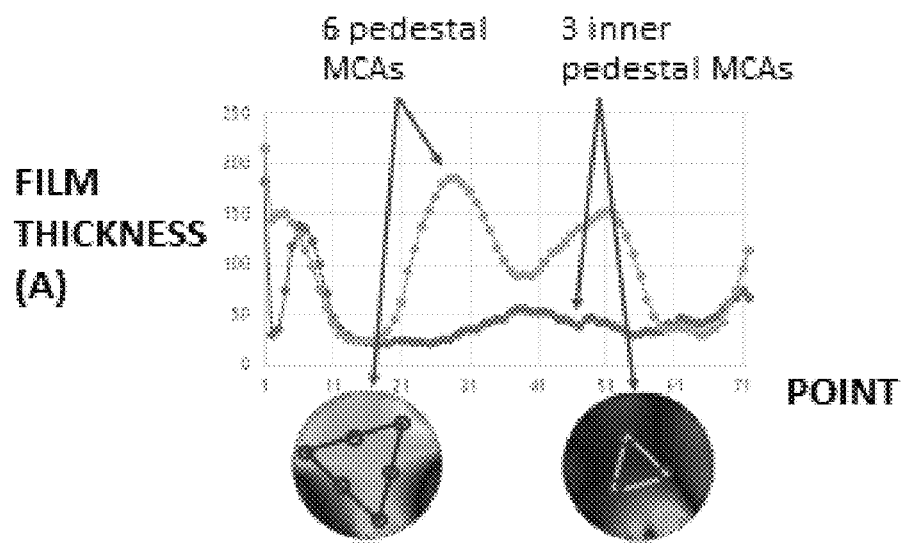
FIG. 10 shows a color map of backside film thickness measured at 72 points 3 mm from the outer edge of the wafer (measured by ellipsometry) and the corresponding graphs (same data points) of backside deposition comparing a wafer supported by six wafer supports and a wafer supported by three inner wafer supports for a single-piece pedestal.

FIG. 10 shows a color map of backside film thickness measured at 72 points 3 mm from the outer edge of the wafer (measured by ellipsometry) and the corresponding graphs (same data points) of backside deposition comparing a wafer supported by six wafer supports and a wafer supported by three inner wafer supports for a single-piece pedestal. As shown by the color map and corresponding graph, there is substantially less backside deposition for wafers supported by only three inner wafer supports than wafers supported by six wafer supports. With six wafer supports, backside deposition is relatively uneven and high backside deposition occurs near the wafer supports. With three inner wafer supports, backside deposition is relatively even and low backside deposition occurs throughout the wafer, indicating at least some of the outer edge of the wafer contacts the pedestal.

Table 2 shows supporting data for the color map and corresponding graph.

TABLE 2

| Parameter | Measurement Method | Reference Process Baseline | Small Pocket Pedestal | Small Pocket Pedestal |
|---|---|---|---|---|
|  |  | 6 MCAs, 2 mil | 6 MCAs, 2 mil | 3 center MCAs, 1 mil |
| Backside Deposition Thickness | Average of 72-pt ring @ 3 mm EE | 320-350 Å | 98 Å | 48 Å |
|  | @ 4 mm EE | 235 Å | 45 Å | 24 Å |
|  | @ 5 mm EE | 160-170 Å | 20-42 Å | 18-20 Å |
| Frontside in Wafer Uniformity | 49-pt, 350 Å | NJ (R/2) = 0.6-0.7 | 0.9-1.2 (control 0.3) | 0.9 |
| Frontside defects >0.045 um | SP3 300 Å LT-ALD Ox | 20 | 73-21 (decreasing with conditioning) | 23-39 |
| Backside defects >0.12 um | SP3 | Single digit | 24-41 (control 6-21) | 100-150 |

Figure 11:
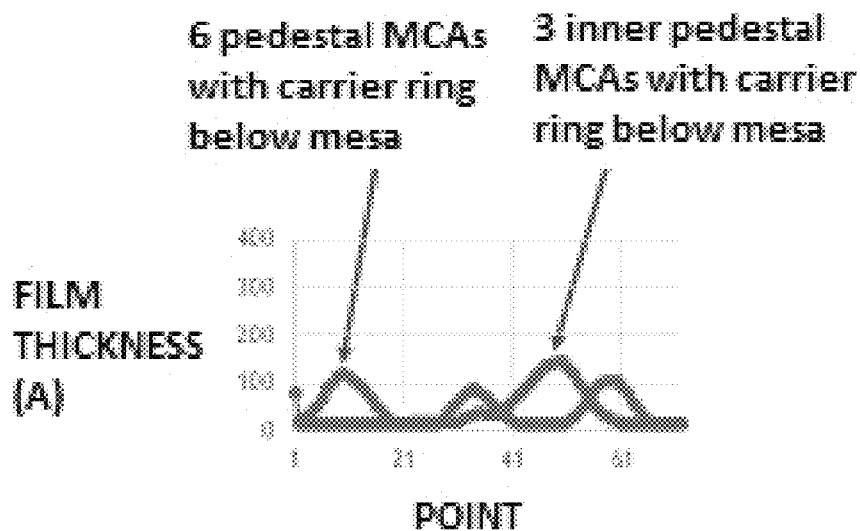
FIG. 11 shows a graph comparing a wafer supported by six wafer supports and a wafer supported by three inner wafer supports for a pedestal with a carrier ring, where the carrier ring is below the mesa of the pedestal.

FIG. 11 shows a graph comparing a wafer supported by six wafer supports and a wafer supported by three inner wafer supports for a pedestal with a carrier ring, where the carrier ring is below the mesa of the pedestal. With six wafer supports, at least three spots of high backside deposition occur corresponding to the location of the outer wafer supports. With three wafer supports, one spot of high backside deposition occurs. This shows that limiting the wafer supports to the inner wafer supports can reduce backside deposition, but that a gap can still exist between the carrier ring and the wafer to permit some backside deposition. That gap can result from the step down surface of the carrier ring being positioned lower than the wafer-facing surface of the pedestal.

Figure 12:
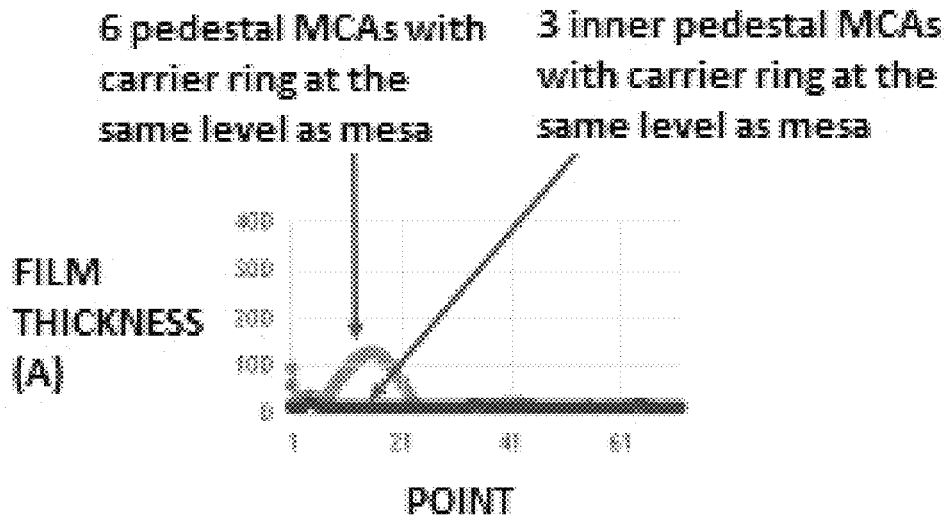
FIG. 12 shows a graph comparing a wafer supported by six wafer supports and a wafer supported by three inner wafer supports for a pedestal with a carrier ring, where the carrier ring is at the same level as the mesa of the pedestal.

FIG. 12 shows a graph comparing a wafer supported by six wafer supports and a wafer supported by three inner wafer supports for a pedestal with a carrier ring, where the carrier ring is at the same level as the mesa of the pedestal. The carrier ring can be raised by a spacer so that the step down surface of the carrier ring is closer to the backside of the wafer. With six wafer supports, one spot of high backside deposition occurs. Even though the carrier ring is closer to the backside of the wafer to minimize backside deposition, at least one gap can be present to provide a pathway for backside deposition. With three inner wafer supports, the wafer can sag and make contact with the carrier ring to provide an edge seal around the outer edge of the wafer. Backside deposition is substantially absent, indicating that full contact around the outer edge of the wafer is achieved under such conditions.

Table 3 shows supporting data for the aforementioned graphs.

TABLE 3

| Parameter | Measurement Method | Reference Process Baseline | Carrier Ring and Pedestal | Carrier Ring and Pedestal | Carrier Ring and Pedestal | Carrier Ring and Pedestal |
|---|---|---|---|---|---|---|
|  |  | 6 MCAs, 2 mil | 6 MCAs, 2 mil, shim 5 mil | 3 center MCAs, 2 mil, shim 5 mil | 6 MCAs, 2 mil, shim 6 mil | 3 center MCAs, 1 mil, shim 6 mil |
| Backside Deposition Thickness | Average of 72-pt ring @ 3 mm EE | 320-350 Å | 22-48 Å | 18 Å | 50 Å | 17 Å |
|  | @ 4 mm EE | 235 Å | 17-26 Å | 15 Å | 25 Å | 16 Å |
|  | @ 5 mm EE | 160-170 Å | 21-52 Å | 14-15 Å | 16 Å | 15-25 Å |

TABLE 3-continued

| | Measurement Method | Reference Process Baseline | Carrier Ring and Pedestal | Carrier Ring and Pedestal | Carrier Ring and Pedestal | Carrier Ring and Pedestal |
|---|---|---|---|---|---|---|
| Frontside in Wafer Uniformity | 49-pt, 350 Å | MJ (R/2) = 0.6-0.7 | MJ (R/2) = 0.6-1 | 1 | 1 | 0.9-1 |
| Frontside defects >0.045 um | SP3 300 Å LT-ALD Ox | 20 | 21 (range 9-33) | 8-21 | 40 (single wafer) | 19-27 |
| Backside defects >0.12 um | SP3 | Single digit | 21 (range 8-42) | ~150 (no indexing) | Single digit | Single digit |

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. An apparatus for processing a wafer, the apparatus comprising:
   a pedestal for supporting the wafer in the apparatus, wherein the pedestal includes a wafer-facing surface extending from a central axis to an outer edge;
   one or more wafer supports configured to extend from the pedestal to support the wafer above the wafer-facing surface, the one or more wafer supports symmetrically arranged about the central axis, each of the wafer supports being spaced from the central axis by about half or less than half of the radius of the wafer; and
   a controller configured with instructions for performing the following operations:
   (a) providing the wafer over the pedestal and the one or more wafer supports;
   (b) contacting a backside of the wafer with the one or more wafer supports to support the wafer above the wafer-facing surface; and
   (c) positioning the one or more wafer supports so that an outer edge of the wafer sags and substantially contacts a surface of the apparatus opposite the backside of the wafer so as to limit access by process gases to the backside of the wafer during a deposition process.

2. The apparatus of claim 1, wherein the one or more positioned wafer supports causes the outer edge of the wafer to substantially contact the wafer-facing surface of the pedestal.

3. The apparatus of claim 1, further comprising:
   a carrier ring having an annular body and surrounding the outer edge of the wafer-facing surface of the pedestal.

4. The apparatus of claim 3, wherein the one or more positioned wafer supports causes the outer edge of the wafer to substantially contact the carrier ring.

5. The apparatus of claim 3, wherein the carrier ring defines a lower gap between a bottom surface of the carrier ring and the pedestal and defines an upper gap between an upper surface of the carrier ring and the wafer, the bottom gap being less than about 6 mil and the upper gap being less than about 3 mil.

6. The apparatus of claim 5, wherein the upper gap is less than about 1 mil when the one or more wafer supports are positioned.

7. The apparatus of claim 1, wherein the one or more wafer supports comprises at least three minimum contact area (MCA) support members symmetrically arranged about the central axis.

8. The apparatus of claim 7, wherein the at least three MCA support members are arranged in a triangular pattern about the central axis.

9. The apparatus of claim 1, wherein the one or more wafer supports comprises an annular support member symmetrically arranged about the central axis of the wafer-facing surface of the pedestal.

10. The apparatus of claim 1, wherein the outer edge of the wafer sags at least about 2 mil below a center of the wafer when the one or more wafer supports are positioned.

11. The apparatus of claim 1, wherein at least 90% of the outer edge of the wafer makes contact with the surface of the apparatus when the one or more wafer supports are positioned.

12. The apparatus of claim 1, wherein the one or more wafer supports are more proximate to the central axis than the outer edge of the wafer-facing surface.

13. The apparatus of claim 12, wherein the deposition process is an atomic layer deposition (ALD) process.

14. An apparatus for processing a wafer, the apparatus comprising:
   a pedestal for supporting the wafer in the apparatus, wherein the pedestal includes a wafer-facing surface extending from a central axis to an outer edge;
   an annular wafer support arranged about the central axis and configured to support a backside of the wafer at an outer edge of the wafer; and
   a controller configured with instructions for performing the following operations:
   (a) providing the wafer on the pedestal and over the annular wafer support; and
   (b) contacting a backside of the wafer at the outer edge of the wafer with the annular wafer support to support the wafer above the wafer-facing surface so as to limit access by process gases to the backside of the wafer during a deposition process, wherein the annular wafer support is positioned above the wafer-facing surface to induce sag at the center of the wafer.

15. The apparatus of claim 14, wherein the outer edge of the wafer is raised by at least about 2 mil above the wafer-facing surface of the pedestal when the annular wafer support is positioned.

* * * * *